(12) United States Patent
Shi et al.

(10) Patent No.: US 8,571,149 B2
(45) Date of Patent: *Oct. 29, 2013

(54) DIRECT CONVERSION RF TRANSCEIVER FOR WIRELESS COMMUNICATION

(75) Inventors: Zhongming Shi, San Diego, CA (US); Ahmadreza (Reza) Rofougaran, Newport Coast, CA (US); Arya Reza Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 716 days.

This patent is subject to a terminal disclaimer.

(21) Appl. No.: 12/795,569

(22) Filed: Jun. 7, 2010

(65) Prior Publication Data

US 2010/0248670 A1  Sep. 30, 2010

Related U.S. Application Data

(63) Continuation of application No. 12/168,084, filed on Jul. 4, 2008, now Pat. No. 7,733,981, which is a continuation of application No. 11/743,143, filed on May 1, 2007, now Pat. No. 7,397,868, which is a continuation of application No. 10/052,870, filed on Jan. 18, 2002, now Pat. No. 7,212,586.

(51) Int. Cl.
*H04L 27/06* (2006.01)

(52) U.S. Cl.
USPC ........... 375/344; 375/326; 375/327; 375/374; 375/375; 375/376; 455/164.1; 455/164.2; 455/260; 455/265; 455/192.1

(58) Field of Classification Search
USPC ......... 375/344, 326, 327, 324, 325, 340, 373, 375/375, 376; 455/164.1, 164.2, 455/192.1–192.3, 260, 265
See application file for complete search history.

(56) References Cited

U.S. PATENT DOCUMENTS 6,023,491 A * 2/2000 Saka et al. ..................... 375/326
7,733,981 B2 * 6/2010 Shi et al. ....................... 375/316

* cited by examiner

*Primary Examiner* — Phuong Phu
(74) *Attorney, Agent, or Firm* — Garlick & Markison; Bruce E. Garlick

(57) ABSTRACT

A single chip radio transceiver includes circuitry that enables received wideband RF signals to be down converted to base band frequencies and base band signals to be up converted to wideband RF signals prior to transmission without requiring conversion to an intermediate frequency. The circuitry includes a low noise amplifier, automatic frequency control circuitry for aligning the LO frequency with the frequency of the received RF signals, signal power measuring circuitry for measuring the signal to signal and power ratio and for adjusting frontal and rear amplification stages accordingly, and finally, filtering circuitry to filter high and low frequency interfering signals including DC offset.

20 Claims, 8 Drawing Sheets

DIRECT CONVERSION RF TRANSCEIVER FOR WIRELESS COMMUNICATION

CROSS-REFERENCE To RELATED APPLICATIONS

The present U.S. Utility Patent Application claims priority pursuant to 35 U.S.C. §120, as a continuation, to the following U.S. Utility Patent Application which is hereby incorporated herein by reference in its entirety and made part of the present U.S. Utility Patent Application for all purposes:

U.S. Utility application Ser. No. 12/168,084, entitled "A Direct Conversion RF Transceiver for Wireless Communications," filed Jul. 4, 2008, pending, which claims priority pursuant to 35 U.S.C. §120, as a continuation, to U.S. Utility application Ser. No. 11/743,143, entitled "A Direct Conversion RF Transceiver for Wireless Communications,", filed May 1, 2007, now U.S. Pat. No. 7,397,868, which claims priority pursuant to 35 U.S.C. §120, as a continuation, to U.S. Utility application Ser. No. 10/052,870, entitled "A Direct Conversion RF Transceiver for Wireless Communications," filed Jan. 18, 2002, now U.S. Pat. No. 7,212,586, all of which are hereby incorporated herein by reference in its entirety and made part of the present U.S. Utility Patent Application for all purposes:

BACKGROUND

1. Technical Field

The present invention relates to wireless communications and, more particularly, wideband wireless communication systems.

2. Related Art

Super-heterodyne receivers traditionally receive an RF signal that must be converted to base band by way of an intermediate frequency (IF). Thereafter, the IF signal is amplified and filtered to define a communication channel. In a transmitter, similarly, a base band signal is up converted to the intermediate frequency wherein the amplification and subsequent filtering are carried out at the IF stages. While some systems skip the IF conversion step, wideband systems typically require conversion to IF stages. Depending on the signal bandwidth and the type of communication system, semiconductor devices are not yet able to allow full integration of active filters operating at the elevated intermediate frequencies for a wideband or high data rate communication network. To carry out filtering at the intermediate frequencies, surface acoustic wave filters (SAW) are commonly used. The SAW filters have the drawback, however, of being bulky, heavy and expensive. Additionally, the SAW filters require low impedance matching thereby resulting in high power consumption. Because they are often powered by battery, portable wireless communication devices are not readily adaptable for such systems in that they is are required to be inexpensive, light and consume lower amounts of power. Thus, there is a need to design transceiver systems that eliminate the use of intermediate frequency filters.

An alternate approach to using a higher intermediate frequency that requires the SAW filters is to convert the RF signal to an intermediate frequency that is sufficiently low to allow the integration of on-chip channel selection filters. For example, some narrow band or low data rate systems, such as Bluetooth, use this low intermediate frequency design approach.

One problem using low intermediate frequencies, however, is satisfying image rejection requirements for the systems. The image rejection requirement for the down conversion is hard to meet and is usually limited to about −40 dB. Thus, this low intermediate frequency approach is limited for narrow band or low data rate systems. Wide band or high data rate systems require an intermediate frequency that is not low enough for the integration of channel selection filters given the technology that is available today for semiconductor processes. There is a need, therefore, for a wireless transceiver system that allows for full integration on-chip of circuit designs that support high data rate and wideband communications.

SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Generally, the present invention provides a transceiver that allows for wideband systems formed on a chip that allow for up and down converting from base band and radio frequency without conversion to an intermediate frequency (zero IF).

Figure 1A:
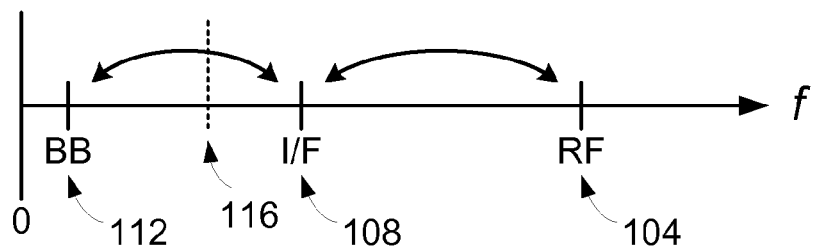
FIGS. 1A, 1B, 1C and 1D are frequency response curves

FIGS. 1A, 1B, 1C and 1D are frequency response curves that illustrate some of the challenges that exist for developing zero IF systems that are all integrated within a semiconductor device. Referring now to FIG. 1A, a signal is transmitted over a wireless medium as an RF signal shown generally at 104. For processing by a receiver, however, that signal is first down converted to an intermediate frequency (IF) shown generally at 108, wherein some preliminary processing occurs. Thereafter, the signal is down converted from intermediate frequency 108 to base band frequency 112.

Figure 1B:
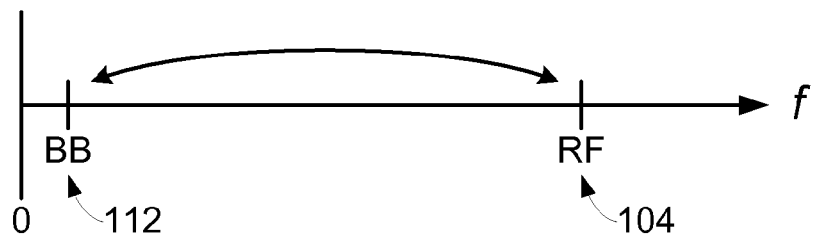

The foregoing discussion about SAW filters may be considered in view of the frequency shown generally at 116. If the intermediate frequency is low enough, then the filters may be developed on chip. As described previously, however, the image rejection of the on chip filters not always satisfactory. Thus, it is desirable to develop a zero IF system, meaning that no intermediate frequencies are used, as is illustrated in FIG. 1B, in order to satisfy image rejection requirements. Accordingly, received signals are transmitted directly from the RF signal 104 to the base band frequency 112 as is shown in FIG. 1B. Similarly, signals that are to be transmitted are up converted from base band frequency 112 to RF signal 104.

Figure 1C:
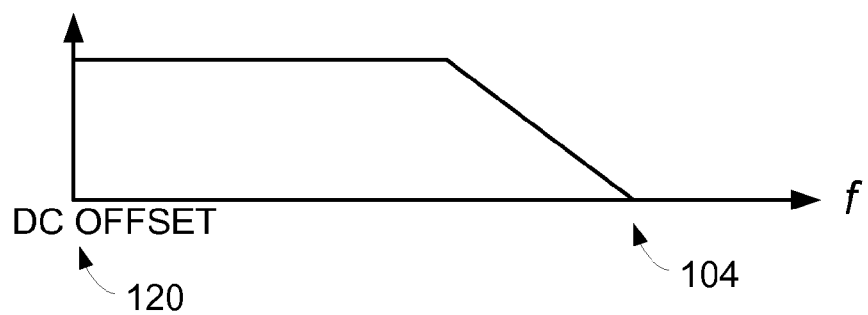
Figure 1D:
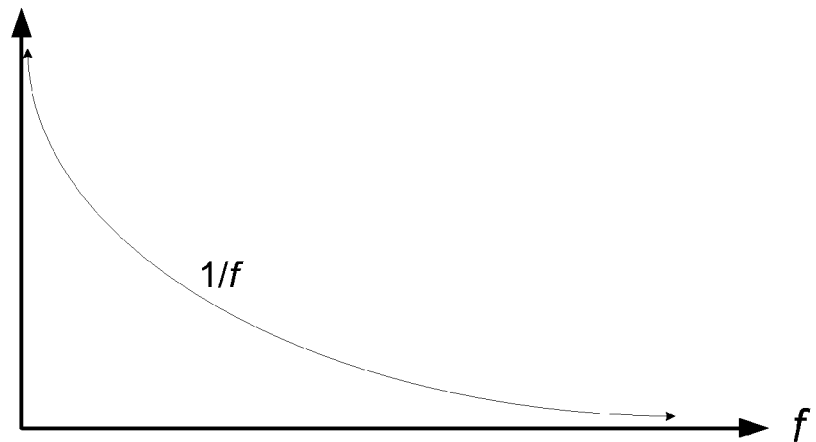

One problem with down converting signals directly from RF signal 104 to base band frequency 112 is that the process of down converting the signal immediately results in a DC offset 120, as is shown in FIG. 1C. Additionally, a noise component, often described as a 1/f interference, is illustrated in FIG. 1D. As may be seen, the 1/f interference is very high at low frequencies but tapers off as the frequency is increased. One problem with the DC offset and the 1/f interference is that any amplification of the received signal includes amplification of interference and/or DC power from the DC offset thereby saturating the amplifier with signals other than the received or target signal.

Figure 1E:
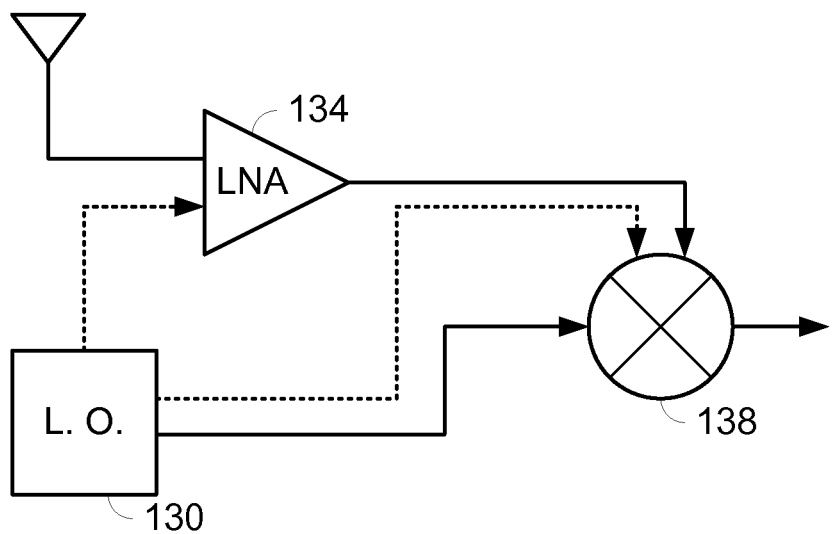
FIG. 1E is a block diagram that illustrate some of the challenges that exist for developing zero IF systems that are all integrated within a semiconductor device.

FIG. 1E further illustrates the process that generates most of the DC offset. For example, a local oscillator (LO) 130 often produces leakage current that is conducted into the input of an amplifier or a mixer. More specifically, as may be seen in FIG. 1E, a local oscillator 130 has leakage current that is conducted into the input of low noise amplifier (LNA) 134 and the input of mixer 138. This type of self mixing produces the most of DC offset at the output of the mixer 138. It is very important, therefore, to eliminate these leakage currents so that the DC offset is at a minimum level.

Figure 2A:
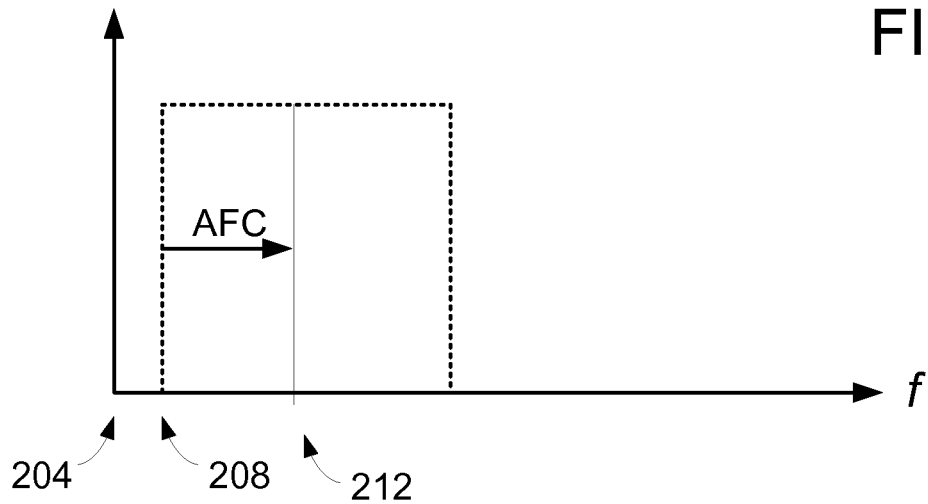
FIGS. 2A and 2B illustrate frequency response curves that are realized by the present inventive system or transceiver.
Figure 2B:
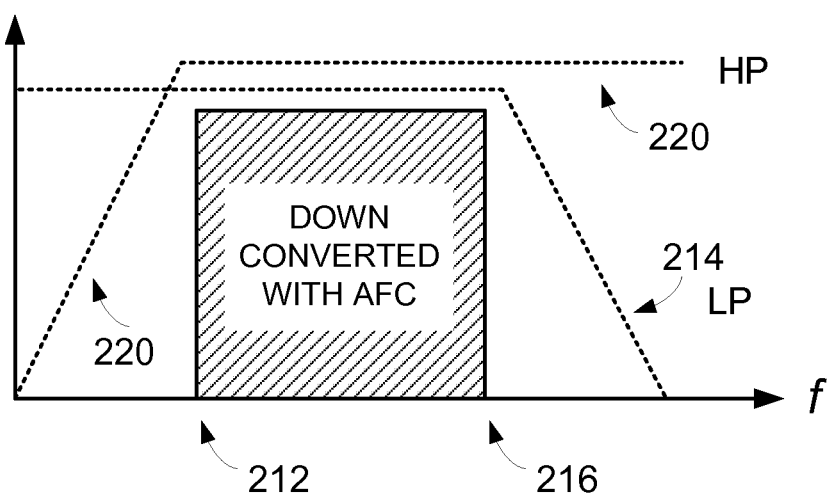

FIGS. 2A and 2B illustrate frequency response curves that are realized by the present inventive system or transceiver. Referring now to FIG. 2A, a DC offset is shown at 204, while the low end of a received signal frequency is shown at 208. FIG. 2B illustrates a high pass (HP) filter 220 that eliminates the DC-offset 204 and a low pass (LP) filter 214 that selects the desired signal channel by attenuating higher frequency interference. In reality, with limited accuracy of local oscillation frequency due to cheap reference crystal is used, if received signal could be down converted too low that it could be attenuated by the HP filter 220. And it could be down converted too high that is could be attenuated by the LP filter 214. In order to avoid signal degradation, automatic frequency control (AFC) is proposed as show in FIG. 2A. Accordingly, the invention includes a transceiver that determines the difference between frequency 208 and ideal frequency 212 (as shown in FIG. 2B) and adjusts LO frequency so that the low end of the received signal is located at 212 and the high end of the signal is located at 216.

FIG. 2B illustrates that the down converted signal after LO frequency correction is located in the desired frequency range, wherein the low end of the frequency is at 212 and the high end is at 216. As may be seen, the channel for the received signal now ranges from the frequency shown at 212 to the frequency shown at 216. Moreover, FIG. 2B shows a high pass filter frequency response curve 220. As may be seen, the channel of the received signal is well beyond the attenuation part of HP filter curve 220. Without adjusting the frequency of LO, the high pass filter, whose frequency response curve is shown in FIG. 2B, would have filtered or eliminated some of the received signal thereby losing information. Thus, FIGS. 2A and 2B suggest that the inventive system includes circuitry for not only correcting LO frequency, but also to filter the received signal thereafter with a high pass filter and a low pass filter.

Figure 3:
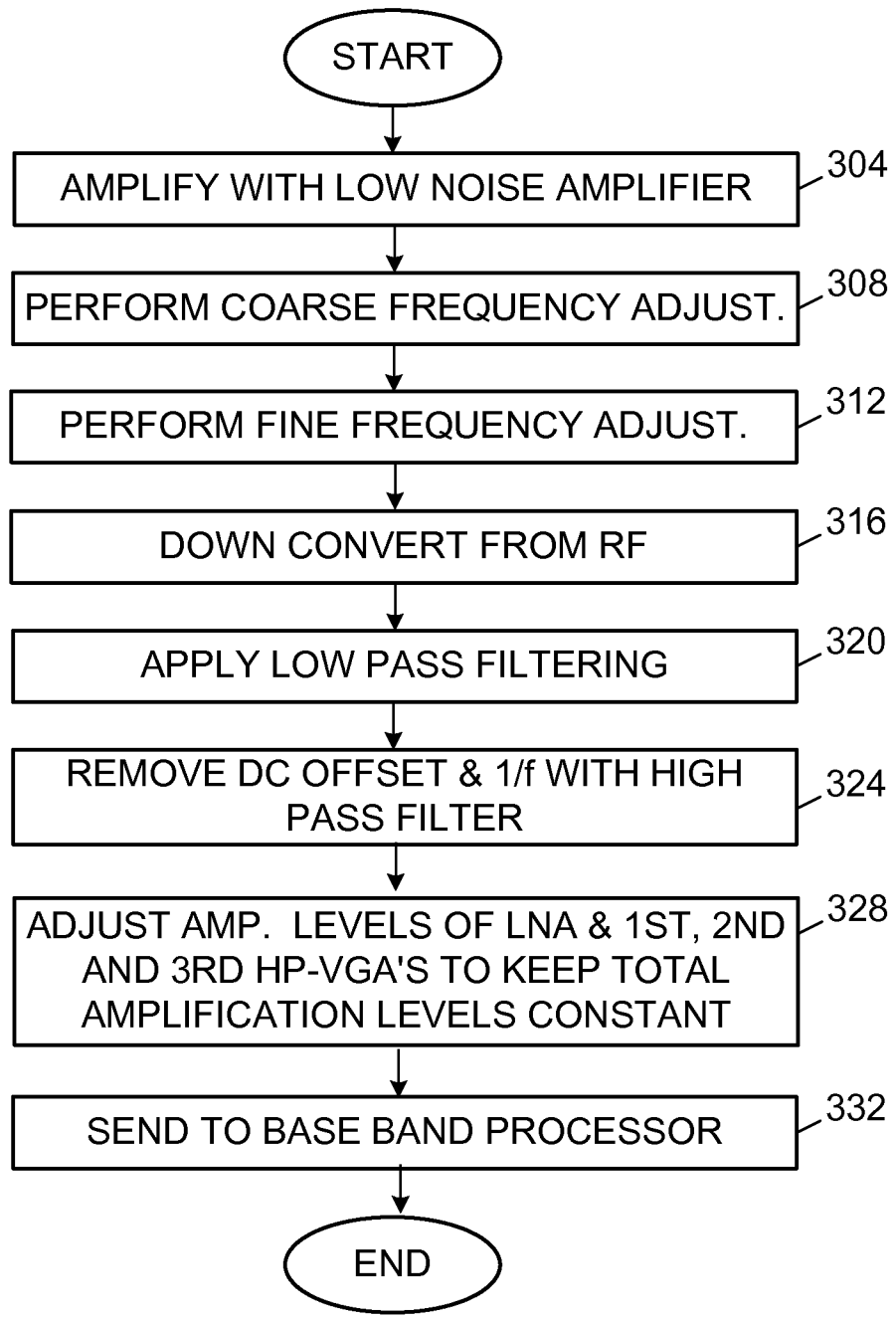
FIG. 3 is a flowchart illustrating an overall method performed by the inventive transceiver according to one embodiment of the present invention.

FIG. 3 is a flowchart that illustrates an overall method performed by the inventive transceiver according to one embodiment of the present invention. Referring now to FIG. 3, a first process step taken by the transceiver is to amplify a received RF signal with a low noise amplifier (step 304). Thereafter, the frequency of the received signal is adjusted by LO frequency with an automatic frequency control circuitry. In the described embodiment, a coarse adjustment is made (step 308), as well as a fine adjustment that is made in the digital domain (step 312). Thereafter, the signal is down converted from a specified RF channel to a specified base band channel (step 316) and a low pass filter is applied to eliminate interference occurring above the channel (step 320). Thereafter, a DC offset and low frequency interference (e.g., 1/f) is removed with at least one high pass filter tuned to pass the base band channel (step 324). Finally, the signals are amplified by a plurality of amplifiers. The amplification level of the amplifiers is adjusted in an inverse proportional manner according to interference levels so that total amplification remains constant (step 328).

Figure 4:
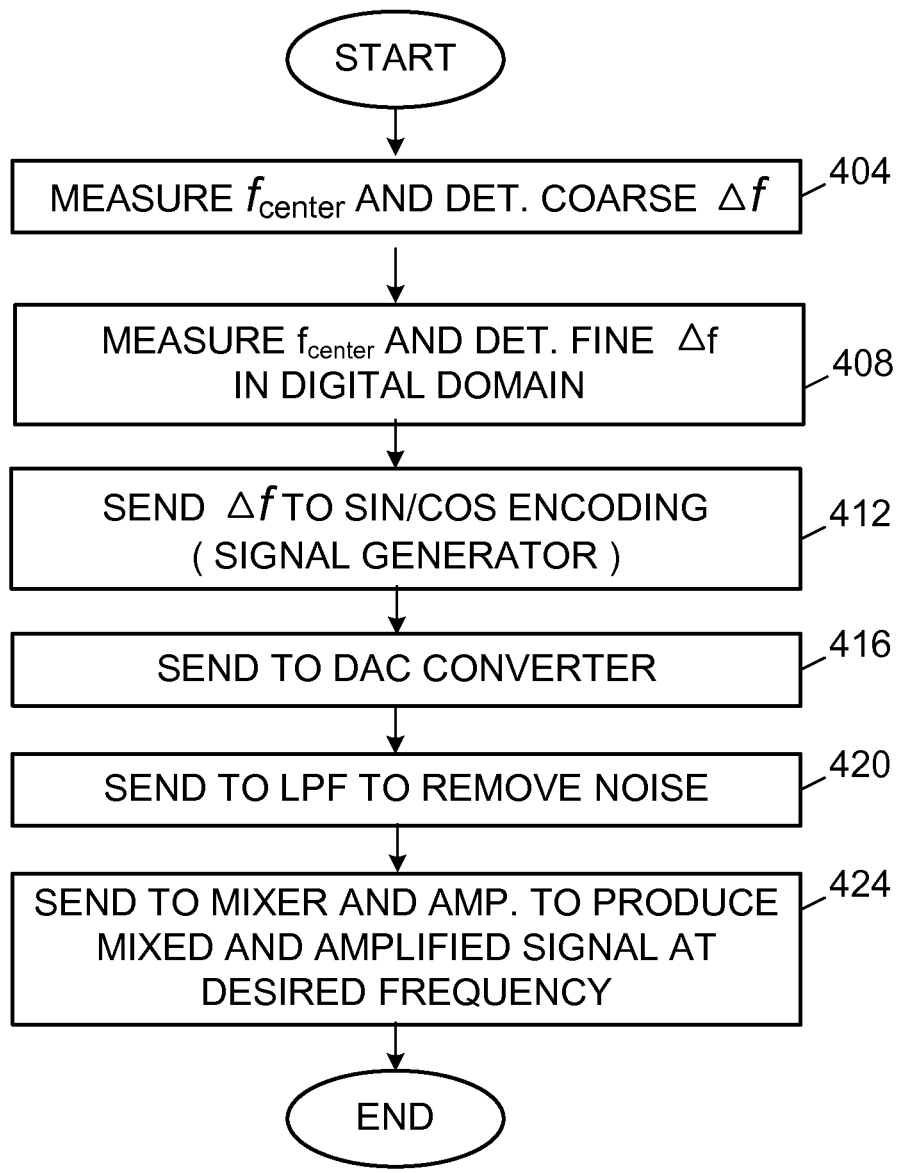
FIG. 4 is a flowchart that illustrates a method for adjusting the channel frequency to a desired channel frequency according to one embodiment of the present invention.

FIG. 4 is a flowchart that illustrates a method for adjusting the channel frequency to a desired channel frequency according to one embodiment of the present invention. Referring now to FIG. 4, the inventive method includes initially measuring a center frequency for the received RF signal and determining the difference between that center frequency and the center frequency of a specified RF channel (step 404). Initially, a coarse difference is measured and is corrected by adjusting LO frequency. Then, the residual difference is adjusted to a fine degree of measurement in the digital domain to obtain an accurate difference between an actual center frequency and a specified center frequency (step 408). The difference in center frequencies is then transmitted to a signal generator (step 412). In the described embodiment of the invention, the signal generator for the transceiver is one that is capable of performing quadrature phase shift keyed modulation of signals. Accordingly, the difference in center frequency values determined in step 404 is transmitted to a sine and a cosine element of an encoder or signal generator.

After the difference in frequency has been sent to the sine/cosine encoders, the signals are transmitted from the encoders to a digital-to-analog converter (step 416). Thereafter, the digital-to-analog converter transmits the signals to a low pass filter to remove high frequency interference (step 420). Thereafter, the signal is transmitted to a mixer to produce a new local oscillator signal output. The new local oscillator output signal is characterized by the desired frequency channel (step 424).

Figure 5:
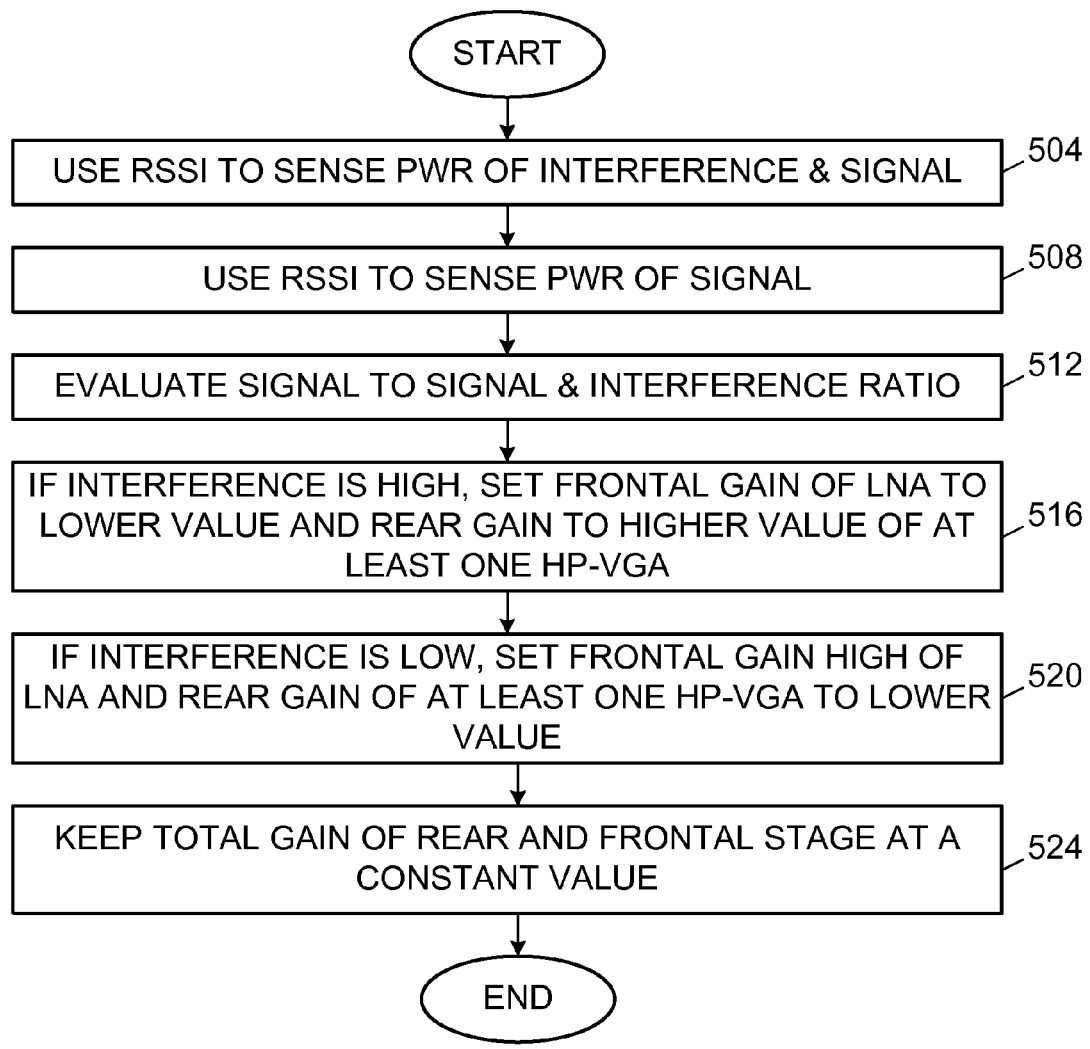
FIG. 5 is a flowchart that illustrates a method for amplifying a received signal in a transceiver according to one embodiment of the present invention.

FIG. 5 is a flowchart that illustrates a method for amplifying a received signal in a transceiver according to one embodiment of the present invention. The method of FIG. 5 generally includes using a plurality of received signal strength indicators (RSSI) to sense the power of the received interference and signal to determine a right amplification of cascaded amplifier stages. Initially, a first RSSI is used to sense the power of the received interference and signal (step 504). Thereafter, a second RSSI is used to sense the power of the signal without the interference (step 508). After measuring the power of the signal, as well as the power of the interference and signal, the transceiver evaluates the ratio of signal power to signal and interference power to determine optimal amplification techniques by each of a plurality of amplifiers (step 512). If the interference level is high, the gain of a first amplifier is set to a lower value and the rear gain of a second amplifier, which is located after channel selection filter, is set to a higher value in a multi-amplifier system (step 516). If the interference value is relatively low, the frontal gain is set to a higher value and the rear gain is set to a lower value (step 520). As the gain of the frontal and rear amplifiers are adjusted, they are adjusted in a manner wherein the total amplification is kept at a constant level required for certain power level of desired channel or signal (step 524). In the described embodiment, an LNA is used for the front end and three high pass variable gain amplifiers (HP-VGA's) are used in subsequent stages.

Figure 6:
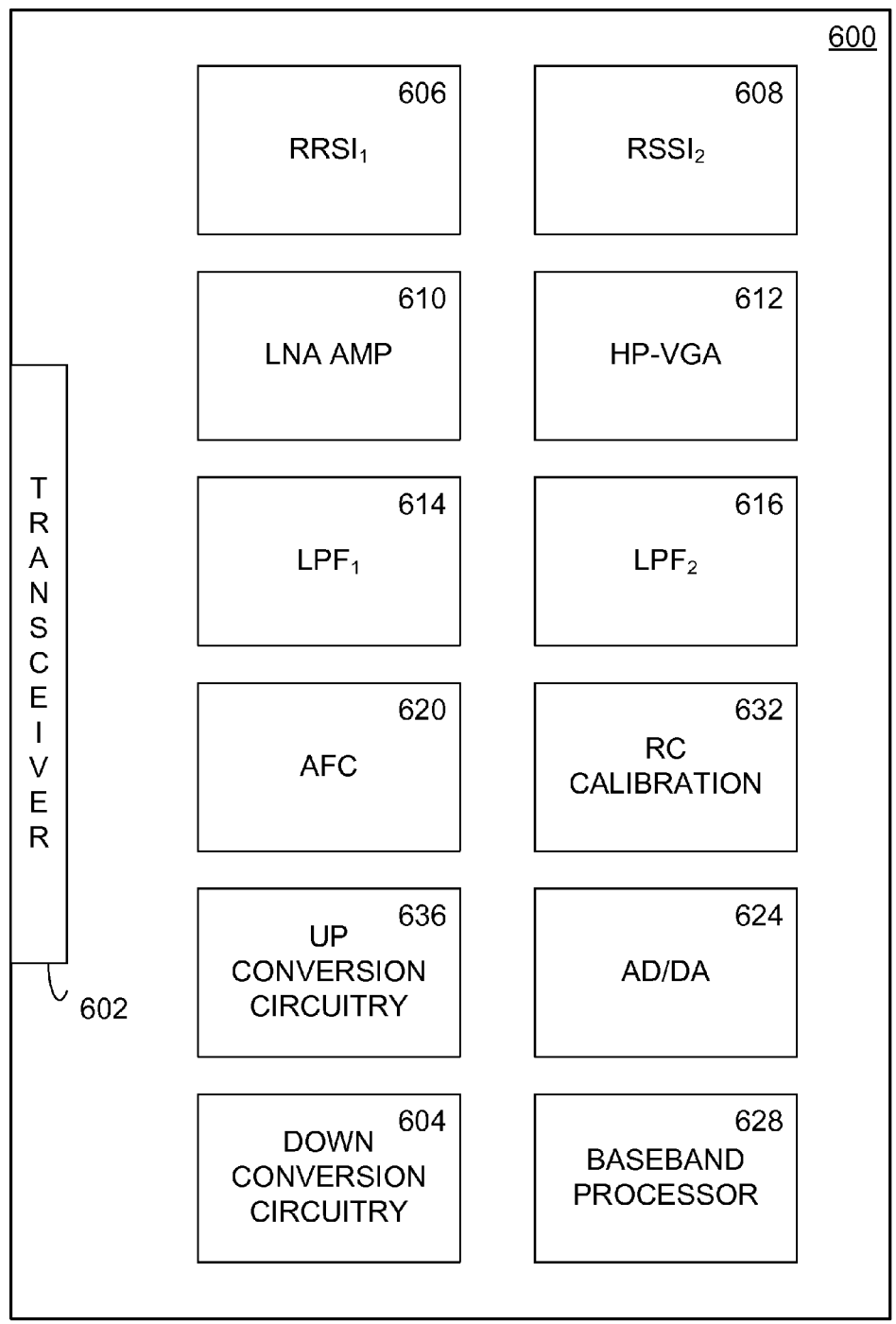
FIG. 6 is a functional block diagram of a transceiver formed according to one embodiment of the present invention.

FIG. 6 is a functional block diagram of a transceiver formed according to one embodiment of the present invention. Referring now to FIG. 6, a transceiver 600 includes a transceiver port 602 for receiving and transmitting communication signals. In the described embodiment of the invention, transceiver port 602 receives signals transmitted at the RF and generates signals that are transmitted externally at the RF.

In addition to transceiver port 602, transceiver 600 further includes a plurality of RSSIs 606 and 608 that are for sensing the power level of the received signals and, more particularly, of the received signal as well as the received signal and interference. Transceiver 600 further includes a pair of low pass filters 614 and 616 and an automatic frequency control (AFC) circuit 620. Automatic frequency control 620 is for adjusting the LO frequency in the zero IF transceiver 600 to align with the desired frequency channel. In the described embodiment, AFC 620 adjusts the frequency of the LO frequency so that the received signal is located within the unattenuated part of HP and LP filters. Transceiver 600 further comprises an A-D and D-A conversion circuitry 624 that is for converting signal formats as required. Additionally, transceiver 600 includes a base band processor 628 that is for processing the received signal and the signal to transmit. Transceiver 600 further includes up conversion circuitry 636 that receives signals that are to be transmitted at base band from base band processor 628 and then up converts the base band signals to the RF for transmission from transceiver port 602. Finally, transceiver 600 includes down conversion circuitry 604 for converting a received RF signal to base band frequencies.

In operation, transceiver port 602 receives RF signals and converts the signals from the RF to base band. The down conversion is performed by down conversion circuitry 604 of FIG. 6. Once the signal has been down converted, the RSSI filters 606 and 608 sense the power of the signal, as well as the signal plus interference, to determine the manner in which the amplification stages should be set for the received signal. While transceiver 600 shows a pair of low pass filters 614 and 616 which are used as a part of filtering higher frequency interference during the down conversion process as well as during the automatic frequency control or adjustment process by AFC 620, it is understood that transceiver 600 may include more than or less than two low pass filters. In general, low pass filters 614 and 616 represent the low pass filtering that occurs during the down-conversion process as well as during the automatic frequency control process to adjust the frequency of the received signals. Thus, in addition to sensing the power levels of the signal and interference of the received signal, the frequency is adjusted by AFC 620 at which time it is filtered by high pass filter to remove DC offset and the 1/f interference. After the low frequency interference has been removed, as well as the high frequency interference from the various filters, the signal is amplified and converted into digital domain for processing by the base band processor. The signal is amplified by LNA amp 610 and HP-VGA amps 612, whose total amplification is kept at a constant value (for a certain power level of received signal) but whose individual amplification is either increased or decreased according to the signal and signal plus interference ratios described earlier.

Figure 7:
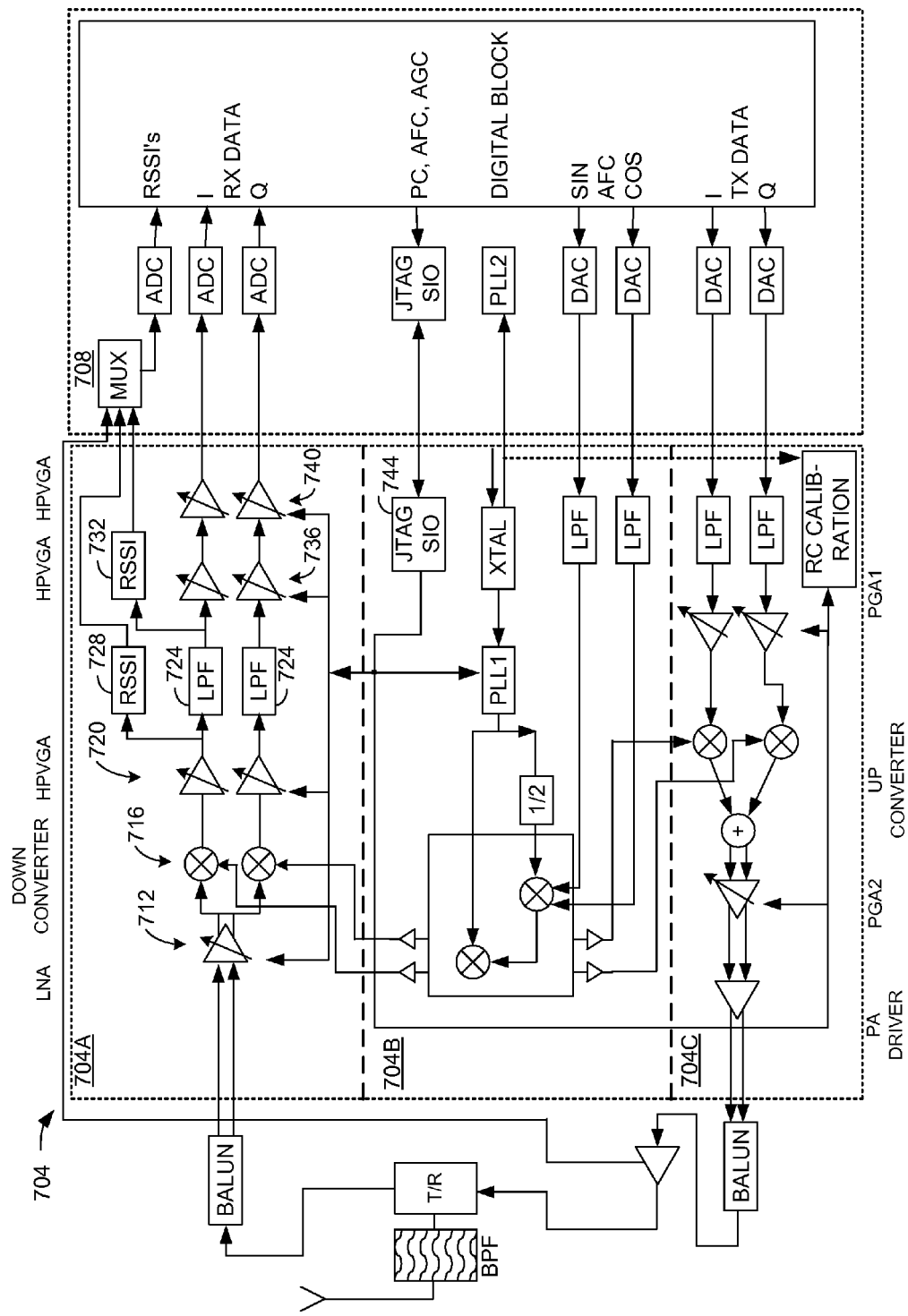
FIG. 7 is a functional schematic diagram of a transceiver formed according to one embodiment of the present invention.

FIG. 7 is a functional schematic diagram of a transceiver formed according to one embodiment of the present invention. Referring now to FIG. 7, a transceiver system comprises radio circuitry 704 that is coupled to base band processing circuitry 708. The radio circuitry 704 performs filtering, amplification, frequency calibration (in part) and frequency conversion (down from the RF to base band and up from base band to the RF). Base band circuitry 708 performs the traditional digital signal processing in addition to partially performing the automatic frequency control. As may be seen, the single chip radio circuitry 704 is coupled to receive radio signals that are initially received by a transceiver and then converted by a Balun signal converter which performs single end to differential conversion for the receiver (and differential to single end conversion for the transmitter end). The Balun are shown to be off chip in FIG. 7, but they may be formed on chip with radio circuitry 704 as well.

More specifically, radio circuitry 704, and more particularly, portion 704A, includes a low noise amplifier 712 that is coupled to receive the RF from a transceiver port. The low noise amplifier 712 then produces an amplified signal to a mixer 716 that is for adjusting and mixing the RF as a part of the automatic frequency control that is performed by the radio and base band circuits 704 and 708. The outputs of the mixer (I and Q of a quadrature phase shift keyed signals) are then produced to a first HP-VGA stage 720.

The outputs of the first HP-VGA stage 720 are then produced to a first RSSI 728 as well as to a low pass filter stage 724. The outputs of the low pass filter stage 724 are then produced to a second RSSI 732, as well as to a second HP-VGA 736 and third HP-VGA 740 as may be seen in FIG. 7.

In operation, the first RSSI measures the power level of the signal and interference. The second RSSI measures the power level of the signal only. The base band processing circuitry 708 then determines the ratio of the RSSI measured power levels to determine the relative gain level adjustments of the front and rear stage amplification stages. In the described embodiment is of the invention, if the power level of the signal and interference is approximately equal to or slightly greater than the power level of the signal alone, then the first amplification stages are set to a high value and the second amplification stages are set to a low value.

Conversely, if the power level of the signal and interference is significantly greater that the power of the signal alone, thereby indicating significant interference levels, the first amplification stages are lowered and the second amplification stages are increased proportionately.

Automatic frequency control circuit 704B includes low pass filters for filtering I and Q signals and mixer circuitry for actually adjusting LO frequency. The operation of mixers and phase locked loop for adjusting frequencies is known. Circuit 704B further includes JTAG (Joint Test Action Group, IEEE1149.1 boundary-scan standard) serial interface (SIO) circuitry 744 for transmitting control signals and information to circuit portions 704A (e.g., to control amplification levels) and to portion 704B (e.g., to control or specify the desired frequency for the automatic frequency control).

A portion of the automatic frequency control circuitry that determines the difference in frequency between a specified center channel frequency and an actual center channel frequency for a received RF signal is formed within the base band circuitry in the described embodiment of the invention.

This portion of the circuitry includes circuitry that coarsely measures the frequency difference and then uses measures the frequency difference in the digital domain to obtain a more precise measurement.

Finally, radio circuitry portion 704C includes low pass filtration circuitry for removing any interference that is present after base band processing as well as amplification, mixer and up converter circuitry for preparing a base band signal for transmission at the RF.

Figure 8:
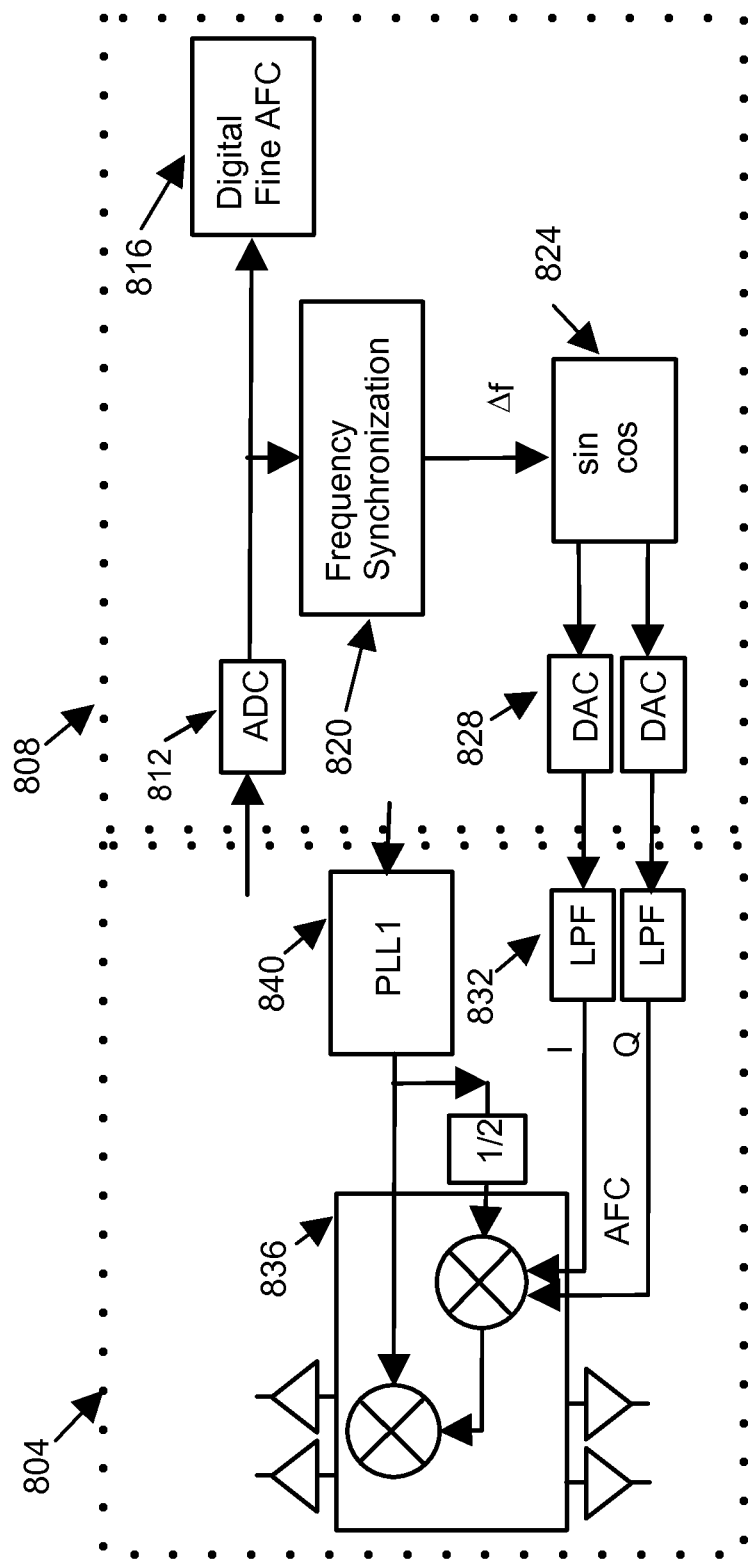
FIG. 8 is a functional schematic diagram of an automatic frequency control (AFC) circuit formed according to one described embodiment of the invention.

FIG. 8 is a functional schematic diagram of an automatic frequency control (AFC) circuit formed according to one described embodiment of the invention. The AFC circuit of FIG. 8 comprises a RF signal processing portion 804 and a base band signal processing portion 808. Generally, portion 804 is for adjusting LO frequency. Portion 808 is for determining the difference in center channel frequencies between the received RF and the expected frequency value for the received signal.

Analog-to-digital converters (ADC) 812 are used to convert the received analog signal into digital. ADC 812 is coupled to provide the received RF signal in a digital format to a frequency synchronization circuitry 820 that measures the frequency difference in a coarse degree of resolution. Digital frequency control circuitry 816 performs its measurements and calibration in the digital domain and provides its results to frequency synchronization circuitry 820 to adjust the frequency difference of frequency synchronization circuit 820 with a fine degree of resolution.

Frequency synchronization circuit 820, as a part of determining the difference in center channel frequency for the received signal and an expected value, receives and interprets a pilot signal that defines the expected center channel frequency. Accordingly, after measuring the actual center channel frequency of the received RF, frequency synchronization circuit 820 is able to determine the frequency difference. Frequency synchronization circuit 820 then produces a signal defining the difference in center channel frequency for the received signal and an expected value to signal generator 824. It is understood that the pilot channel is transmitted as a part of standard wireless network communication protocols for signal control and synchronization purposes.

Signal generator 824, upon receiving the difference in center channel frequency for the received signal and an expected value, produces quadrature phase shift keyed (I & Q) outputs for the received frequency difference to a pair of digital to analog converters (DAC) 828. The analog outputs of DAC 828 are then passed to low pass filters 832 and are then up converted back to the RF. The I and Q RF signal components are then produced to mixer circuitry 836 that also receives a specified input from phase locked loop circuitry 840 to produce a received RF having a specified center channel frequency. It is understood that mixer circuitry 836 (including PLL circuitry 840) further receives control signals from base band processing circuitry (not shown in FIG. 8) specifying the expected center channel frequency that is specified in the aforementioned pilot channel.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

The invention claimed is:

1. A transceiver, comprising:
   a receive path configured to receive ingoing radio frequency (RF) signals and coupled to produce ingoing digital signals to a processor;
   down conversion circuitry disposed within the receive path and configured to receive the ingoing RF signals wherein the down conversion circuitry produces down-converted communication signals based on the received ingoing RF signals based on a frequency adjusted oscillation;
   a phase-locked loop that produces a local oscillation;
   wherein the processor is configured to generate a digital oscillation correction signal;
   analog to digital conversion circuitry configured to convert the digital oscillation correction signal to a continuous waveform oscillation correction signal;
   a first mixer configured to mix a divided local oscillation that is based upon the local oscillation with the continuous waveform oscillation correction signal; and
   a second mixer that mixes the local oscillation with an output of the first mixer to produce the frequency adjusted oscillation.

2. The transceiver of claim 1, wherein the digital oscillation correction signal is based on a difference between a center frequency of the ingoing RF signals and an expected center frequency of the ingoing RF signals.

3. The transceiver of claim 1 wherein the down conversion circuitry produces quadrature phase shift keyed down-converted communication signals.

4. The transceiver of claim 3 wherein the quadrature phase shift keyed down-converted communication signals comprise in-phase and quadrature phase signal components.

5. A transceiver, comprising;
   phase locked loop circuitry configured to generate a coarsely tuned local oscillation (LO) based upon a frequency specified within a pilot signal;
   digital frequency correction logic configured to generate a digital local oscillation correction signal based on a detected difference between the frequency specified within the pilot signal and a received radio frequency (RF) signal frequency; and
   mixing circuitry configured to adjust the coarsely tuned LO based in part upon a continuous waveform local oscillation correction signal that is further based upon the digital local oscillation correction signal and that down converts the received RF signal, the mixing circuitry including:
      first mixing circuitry that mixes an analog form local oscillation correction signal with a divided coarsely tuned LO to produce an adjusted divided oscillation; and
      second mixing circuitry that mixes the adjusted divided oscillation with the coarsely tuned LO.

6. The transceiver of claim 5, wherein the digital local oscillation correction signal is based on a difference between a center frequency of the received RF signal and an expected center frequency of the received RF signal.

7. The transceiver of claim 6 wherein the expected center frequency is based upon an indication received in a pilot signal.

8. The transceiver of claim 5 wherein the continuous waveform oscillation correction signal produces a fine frequency adjustment to the local oscillation in addition to frequency adjustments made by the phase-locked loop circuitry.

9. A method in a high data rate communication transceiver comprising:
- receiving ingoing radio frequency (RF) signals and producing ingoing digital signals to a processor;
- producing a coarsely tuned local oscillation;
- generating a digital oscillation correction signal for adjusting a frequency of a divided coarsely tuned local oscillation;
- generating a continuous waveform oscillation correction signal based upon the digital oscillation correction signal;
- mixing the continuous waveform oscillation correction signal with a divided coarsely tuned local oscillation to produce an adjusted and divided local oscillation;
- mixing the adjusted and divided local oscillation with the coarsely tuned local oscillation to produce an adjusted local oscillation; and
- down-converting the received RF signals with the adjusted local oscillation as a part of producing the ingoing digital signals to the processor.

10. The method of claim 9, further including:
- receiving a pilot signal;
- evaluating the pilot signal and determining an expected center frequency of the ingoing RF signals; and
- generating the digital oscillation correction signal based on a difference between a center frequency of the ingoing RF signals and the expected center frequency of the ingoing RF signals.

11. The method of claim 9 further including producing phase shift keyed down converted communication signals.

12. The method of claim 11 wherein the phase shift keyed down-converted communication signals comprise in-phase and quadrature phase signal components.

13. The method of claim 12 further including adjusting a local oscillation frequency to a desired RF channel for the in-phase and quadrature phase signal components.

14. The method of claim 9, further including:
- producing the coarsely tuned local oscillation using a phase-locked loop circuit;
- producing the digital oscillation correction signal and converting the digital oscillation correction signal to an analog signal form to produce the continuous waveform oscillation correction signal;
- adjusting the coarsely tuned local oscillation using the phase-locked loop circuit as a coarse frequency adjustment; and
- adjusting the coarsely tuned local oscillation produced by the phase-locked loop circuit based on the continuous waveform oscillation correction signal as a fine frequency adjustment to produce the adjusted and divided local oscillation.

15. The transceiver of claim 1, further comprising filtering circuitry configured to filter the continuous waveform oscillation correction signal.

16. The transceiver of claim 1, wherein the processor comprises a baseband processor.

17. The transceiver of claim 5, further comprising analog to digital conversion circuitry configured to convert the digital local oscillation correction signal to a continuous waveform local oscillation correction signal.

18. The transceiver of claim 5, wherein the digital frequency correction logic comprises a baseband processor.

19. The method of claim 9, wherein the ingoing digital signals comprise at least one of Wireless Local Area Network (WLAN) signals and cellular wireless communication signals.

20. The transceiver of claim 5 further comprising circuitry configured to adjust the coarsely tuned LO frequency to a desired RF channel.

* * * * *